(12) United States Patent  (10) Patent No.: US 12,403,497 B2
Han et al.  (45) Date of Patent: Sep. 2, 2025

(54) APPARATUS AND METHOD FOR MANUFACTURING HIGH-DENSITY IN-LINE CARBON NANOTUBE THIN FILM

(71) Applicants: BEIJING HUA TAN YUAN XIN ELECTRONICS TECHNOLOGY CO., LTD, Beijing (CN); BEIJING INSTITUTE OF CARBON-BASED INTEGRATED CIRCUIT, Beijing (CN)

(72) Inventors: Jie Han, Beijing (CN); Hui Wang, Beijing (CN)

(73) Assignee: BEIJING HUA TAN YUAN XIN ELECTRONICS TECHNOLOGY CO., LTD, Beijing (CN)

( * ) Notice: Subject to any disclaimer, the term of this patent is extended or adjusted under 35 U.S.C. 154(b) by 558 days.

(21) Appl. No.: 17/640,224

(22) PCT Filed: Sep. 4, 2020

(86) PCT No.: PCT/CN2020/113382
§ 371 (c)(1),
(2) Date: Mar. 3, 2022

(87) PCT Pub. No.: WO2021/043236
PCT Pub. Date: Mar. 11, 2021

(65) Prior Publication Data
US 2022/0314265 A1  Oct. 6, 2022

(30) Foreign Application Priority Data
Sep. 4, 2019 (CN) .......................... 201910831548.3
Sep. 4, 2019 (CN) .......................... 201910831550.0
(Continued)

(51) Int. Cl.
B32B 9/00 (2006.01)
B05C 3/02 (2006.01)
(Continued)

(52) U.S. Cl.
CPC ............... *B05C 3/02* (2013.01); *B05D 1/18* (2013.01); *B05D 7/24* (2013.01); *C01B 32/159* (2017.08);
(Continued)

(58) Field of Classification Search
CPC ... Y10T 428/30; C01B 32/159; C01B 32/168; B05C 3/02
(Continued)

(56) References Cited

U.S. PATENT DOCUMENTS 7,785,472 B2   8/2010  Murakoshi
10,519,333 B2  12/2019 Hladik

FOREIGN PATENT DOCUMENTS

CN  1922106 A     2/2007
CN  102802772   * 11/2012
(Continued)

OTHER PUBLICATIONS

International Preliminary Report on Patentability directed to the related International Patent Application No. PCT/CN2020/113382, mailed on Mar. 8, 2022, 12 pages.
(Continued)

*Primary Examiner* — Daniel H Miller
(74) *Attorney, Agent, or Firm* — Emerson, Thomson & Bennett, LLC; Roger D. Emerson; Todd A. Fichtenberg

(57) ABSTRACT

The present disclosure discloses a device and a method for preparing a high-density aligned carbon nanotube film. The device includes a container main body, a buffer partition plate and a solvent lead-out part. The buffer partition plate is located at a lower part of the container main body. The
(Continued)

solvent lead-out part communicates with an interior of the container main body through a through hole in a side wall of the container main body and extends to an outside of the container main body. The method includes injecting a carbon nanotube solution into a container; immersing a substrate in the carbon nanotube solution; injecting a sealing liquid that is immiscible with the carbon nanotube solution along the substrate or the side wall of the container main body; and leading the solvent out or pulling the substrate such that the liquid surface of the substrate undergoes relative motion.

7 Claims, 6 Drawing Sheets

(30) Foreign Application Priority Data

Sep. 4, 2019 (CN) .......................... 201910831824.6
Sep. 4, 2019 (CN) .......................... 201910831831.6

(51) Int. Cl.
| | | |
|---|---|---|
| B05D 1/18 | (2006.01) | |
| B05D 7/24 | (2006.01) | |
| C01B 32/159 | (2017.01) | |
| C01B 32/168 | (2017.01) | |
| C01B 32/17 | (2017.01) | |
| C01B 32/174 | (2017.01) | |
| H10K 85/20 | (2023.01) | |
| B82Y 30/00 | (2011.01) | |
| B82Y 40/00 | (2011.01) | |
| G03F 7/039 | (2006.01) | |
| H10K 71/13 | (2023.01) | |

(52) U.S. Cl.
CPC ............ *C01B 32/168* (2017.08); *C01B 32/17* (2017.08); *C01B 32/174* (2017.08); *H10K 85/221* (2023.02); *B82Y 30/00* (2013.01); *B82Y 40/00* (2013.01); *C01B 2202/02* (2013.01); *C01B 2202/04* (2013.01); *C01B 2202/06* (2013.01); *C01B 2202/08* (2013.01); *G03F 7/039* (2013.01); *H10K 71/13* (2023.02); *Y10T 428/30* (2015.01)

(58) Field of Classification Search
USPC .......................................................... 428/408
See application file for complete search history.

(56) References Cited

FOREIGN PATENT DOCUMENTS

| | | |
|---|---|---|
| CN | 104334494 A | 2/2015 |
| CN | 110451484 A | 11/2019 |
| CN | 110482530 A | 11/2019 |
| CN | 110589804 A | 12/2019 |
| CN | 110611029 A | 12/2019 |

OTHER PUBLICATIONS

International Search Report and Written Opinion of the International Searching Authority (with English-language translation) mailed Nov. 30, 2020, directed to International Patent Application No. PCT/CN2020/113382, 19 pages.

Gao et al., "Assembly of aligned semiconducting carbon nanotubes in organic solvents via introducing inter-tube electrostatic repulsion," Carbon, vol. 146, pp. 172-180, Jan. 31, 2019.

* cited by examiner

APPARATUS AND METHOD FOR MANUFACTURING HIGH-DENSITY IN-LINE CARBON NANOTUBE THIN FILM

CROSS-REFERENCE TO RELATED APPLICATIONS AND INCORPORATION BY REFERENCE

The present application claims the priority of the international application PCT/CN2020/113382 filed on Sep. 4, 2020, which claims the priority of the Chinese patent application CN201910831550.0 filed on Sep. 4, 2019 and titled "Method for preparing patterned carbon nanotube film", the priority of the Chinese patent application CN201910831824.6 filed on Sep. 4, 2019 and titled "Method for preparing carbon nanotube film by printing method", the priority of the Chinese patent application CN201910831548.3 filed on Sep. 4, 2019 and titled "Method for preparing carbon nanotube film by pulling method", and the priority of the Chinese patent application CN201910831831.6 filed on Sep. 4, 2019 and titled "Device and method for preparing carbon nanotube film". The entire contents of the above applications are incorporated into the present application by reference.

TECHNICAL FIELD

The present disclosure relates to the field of carbon nanotubes, in particular to a method for preparing a high-density aligned carbon nanotube film.

BACKGROUND

Carbon nanotubes are a new type of carbon material discovered in 1990's, and can be categorized into single-walled carbon nanotubes and multi-walled carbon nanotubes. The special structure of carbon nanotubes determines their special properties, such as high tensile strength and high thermal stability; with the change of the helical way of carbon nanotubes, carbon nanotubes can exhibit metallic or semiconducting properties. Due to their ideal one-dimensional structure and excellent properties in the fields of mechanics, electricity, and heat, carbon nanotubes have shown broad application prospects in interdisciplinary fields such as materials science, chemistry, and physics, and more and more attention has been paid to scientific research and industrial applications, but the prepared carbon nanotubes are generally in the form of particles or powders, which causes a lot of inconvenience to the applications for people.

At present, the Langmuir-Schaefer (LS) method can be used to prepare the carbon nanotube film, which was squeezed back and forth at a certain speed by the pushing and pulling plate; then, the carbon tube arrays on the solution can be transferred to the substrate in parallel by the method of Langmuir-Schaefer. Trenches can be dug to allow carbon tubes to enter the trenches. Ribbon-shaped carbon tubes can be prepared by using the evaporation principle. However, these preparation methods still have various deficiencies. The carbon nanotube film prepared by the LS method has large-area inhomogeneity, and the carbon tube film is multi-layered, which has a negative impact on the electrical properties (transistor). Due to the repeated extrusion process, the carbon tubes will be stacked to form multiple layers, and this process cannot ensure that each site is truly uniform.

The disadvantage of using trenches to prepare carbon nanotubes is that the carbon nanotubes obtained by this method are not a continuous film, but strips, which are not suitable for industrialized large-area processing technology; in the method of using the evaporation principle, the minimum trench size can only be 70 nm, which has great limitations.

Therefore, there is currently a need for a method suitable for low-cost, large-area preparation of high-density aligned carbon nanotube film to meet the industrial application of carbon-based integrated circuits.

SUMMARY

The present disclosure aims to provide a device and method for preparing a carbon nanotube film, which is simple in structure, low in cost, suitable for large-area high-density aligned carbon nanotube film, and at the same time, can effectively avoid the problem of uneven thickness of carbon nanotube film.

According to one aspect of the present disclosure, a device for preparing a carbon nanotube film is provided. The device includes a container main body, having a buffer partition plate, the buffer partition plate is located at the lower part of the container main body; and a solvent lead-out part, communicating with the interior of the container main body through the through hole in the side wall of the container main body and extending to the outside of the container main body.

In some embodiments, the buffer partition plate and the inner wall of the container main body are overlapped, bonded, buckled or integrally formed.

In some embodiments, the upper surface of the buffer partition plate is provided with a protruding strip-shaped fixing member and a plurality of through holes.

In some embodiments, the diameter of the through hole is 1-3 mm.

In some embodiments, the solvent lead-out part is located between the buffer partition plate and the bottom of the container main body.

In some embodiments, the solvent lead-out part is perpendicular to the central axis of the container main body or at a certain angle.

Another aspect of the present disclosure provides a method for preparing an aligned carbon nanotube film using the above-mentioned device, comprising the following steps:

First, a carbon nanotube solution is added into the container main body of the device;

the substrate is placed into the container main body vertically;

a sealing liquid that is immiscible with the carbon nanotube solution is added along the substrate or the side wall of the container main body to form two-liquid layers;

the solvent is led out through the solvent lead-out part, so that the liquid level of the carbon nanotube solution gradually drops, thereby forming a carbon nanotube film on the substrate; at the end, the formed film is cleaned.

In some embodiments, the carbon nanotube solution is carbon nanotubes dissolved in one or more halogenated hydrocarbon solvents, and the halogenated hydrocarbon solvent is selected from one or more of chloroform, dichloroethane, trichloroethane, chlorobenzene, dichlorobenzene, and bromobenzene.

In some embodiments, the sealing liquid is one or more of polyol, amine solution or water.

In some embodiments, the temperature of the carbon nanotube film preparation process is from the freezing point of the liquid to the boiling point of the carbon nanotube solution.

Another aspect of the present disclosure provides a method for preparing a high-density carbon nanotube aligned film by a pulling method, mainly comprising the following steps:

S1: a carbon nanotube solution is injected into a container;

S2: a substrate is clamped on a pulling machine and immersed vertically in the carbon nanotube solution;

S3: a sealing liquid that is immiscible with the carbon nanotube solution is injected along the substrate or the sidewall of the container;

S4: the substrate is pulled up to form a carbon nanotube film parallel to the interface between the two-liquid layers on the substrate.

In some embodiments, the carbon nanotube solution is formed by dissolving carbon nanotubes in one or more halogenated hydrocarbons, preferably organic solvents such as chloroform, dichloroethane, trichloroethane, chlorobenzene, dichlorobenzene, and bromobenzene, etc.

In some embodiments, the carbon nanotubes are selected from one or more of single-walled carbon nanotubes, double-walled carbon nanotubes or multi-walled carbon nanotubes.

In some embodiments, the speed of pulling or inserting is 0.1 μm/sec to 20 μm/sec.

In some embodiments, the sealing liquid is one or more of polyol, amine solution or water.

In some embodiments, the substrate is glass, metal, silicon wafer or plastic.

In some embodiments, the step of cleaning the film is included, wherein the cleaning solution is ethanol, isopropanol, acetone, toluene, xylene, and tetrahydrofuran.

In another aspect of the present disclosure, in the above-mentioned step S1, the carbon nanotube solution and a filling medium are injected into the container. The filling medium includes liquid or solid substance, and the liquid is selected from a solvent or a mixture thereof that is dense and immiscible with the carbon nanotube solution, such as dichloroacetic acid, tetrafluoropropanol, heavy liquid, etc. The solid substance is selected from molecular sieves, polytetrafluoroethylene balls, and glass ball fillers. By adding the filling medium into the carbon nanotube solution, the consumption of the carbon nanotube solution is greatly reduced, which has a huge cost advantage, and at the same time, the surface changes caused by the long-term immersion of the substrate in the solution can be avoided.

Another aspect of the present disclosure also provides a method for preparing a carbon nanotube film using a specific solution formula and a pulling method. In step S1, a carbon nanotube solution is injected into a container, and a dispersant is added to form a carbon nanotube-dispersant composite, and then a substance that interacts with the carbon nanotube-dispersant composite is added; then the means of water ultrasonic or probe ultrasonic is used for dispersing for 5 minutes; the substance that interacts with the carbon nanotube-dispersant composite is polyol or mercaptan, preferably 1%-70% 3-methyl-propanediol.

Another aspect of the present disclosure provides a method for preparing a high-density aligned carbon nanotube film, comprising:

S1: a carbon nanotube solution is injected into a container, and a dispersant is added to form a carbon nanotube-dispersant composite, and a carbon nanotube solution containing a dispersant is formed;

S2: a substrate is clamped on a pulling machine and immersed vertically in the carbon nanotube solution containing a dispersant;

S3: a sealing liquid that is immiscible with the carbon nanotube solution is added along the substrate or the side wall of the container, and the sealing liquid contains a substance that interacts with the carbon nanotube-dispersant composite, and forms a two-liquid area around the peripheral local area of the substrate;

S4: the substrate is pulled up to form a carbon nanotube film parallel to the interface between the two-liquid layers on the substrate.

In some embodiments, in step S3, the substrate is inserted downward into the carbon nanotube solution, and a carbon nanotube film perpendicular to the interface between the two-liquid layers is formed on the substrate (12).

In some embodiments, the speed of pulling or inserting the substrate is 0.1 μm/sec to 20 μm/sec.

In some embodiments, the substance that interacts with the carbon nanotube-dispersant composite is polyol.

For the carbon nanotube film prepared by the above-mentioned technical solution, the film-forming speed can be achieved by controlling the moving speed of the substrate, which is very easy to control; in addition, because the carbon nanotube solution does not need to be discharged or evaporated, there will be no loss and pollution, and it can be reused, which will greatly reduce the cost.

The present disclosure has the following beneficial effects:

(1) The present disclosure provides a device with a simple structure that can achieve large-area preparation of an aligned carbon nanotube film. The device obtains a high-density aligned carbon nanotube film by adding a carbon nanotube film of a special formula, and at the same time leading out the solvent to achieve the liquid level change;

(2) When the present disclosure uses the above-mentioned pulling method to prepare the aligned carbon nanotube film, the film-forming speed can be achieved by controlling the moving speed of the substrate, which is very easy to control; in addition, because the carbon nanotube solution does not need to be discharged or evaporated, there will be no loss and pollution, and it can be reused, which will greatly reduce the cost.

(3) By adding the filling medium into the carbon nanotube solution, the present disclosure greatly reduces the consumption of the carbon nanotube solution, which has a huge cost advantage, and is beneficial to industrial application.

BRIEF DESCRIPTION OF THE DRAWINGS

The above and other objects, features and advantages of the present disclosure will be more clearly described by the following description of the technical solutions of the present disclosure with reference to the drawings, in which.

REFERENCE SIGNS

Figure 1:
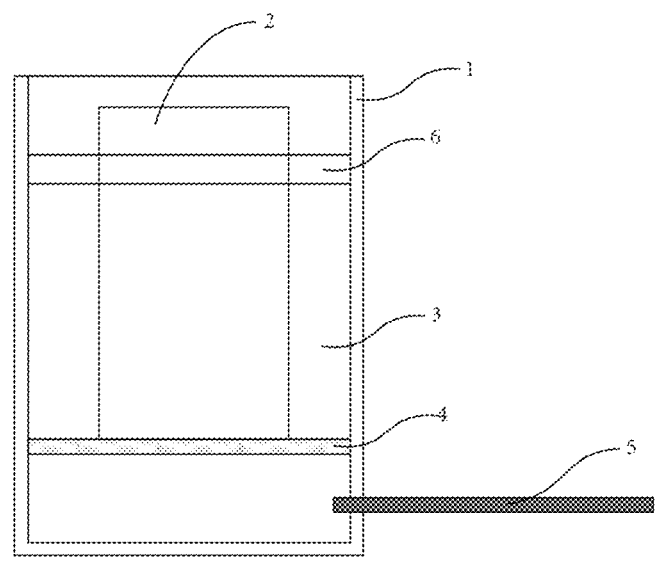
FIG. 1 shows the structural schematic diagram of the device for preparing the carbon nanotube film of the present disclosure.
Figure 2:
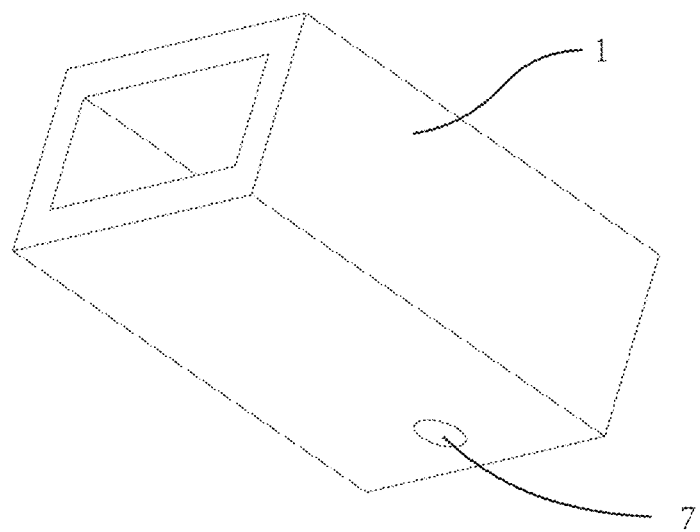
FIG. 2 shows the three-dimensional structural diagram of the container main body.

1—container; 2—substrate; 3—carbon nanotube solution; 4—buffer partition plate; 5—semi-permeable pipeline; 6—sealing liquid; 7—through hole; 8—through hole; 9—protruding stripe

DETAILED DESCRIPTION

Embodiments of the present disclosure will be described in detail below with reference to the drawings. In the various figures, the same components are designated by the same reference numerals, and the various parts of the figures are not drawn to scale. In addition, some common knowledge may not be shown. For the sake of simplicity, the semiconductor structure obtained after several steps can be depicted in one figure.

It should be understood that, in describing the structure of a device, when a layer or area is referred to as being "on" or "over" another layer or area, the layer or area can be directly on another layer or area, or other layers or areas are also included between the layer or area and another layer or area. And, if the device is turned over, the layer or area, will be "under" or "below" another layer or area.

In order to describe the situation directly on another layer or area, the expression "A is directly on B" or "A is on and adjacent to B" will be used herein. In this application, "A is located directly in B" means that A is located in B, and A is directly adjacent to B, rather than A located in a doped area formed in B.

FIG. 1 shows a device for preparing a carbon nanotube film provided by the present disclosure. Specific embodiments of the present disclosure are described in detail below according to the structure shown in FIG. 1 and FIGS. 2-4.

EXAMPLE 1

As shown in FIG. 1, the present disclosure provides a device for preparing a carbon nanotube film, and the device includes a container main body 1, which contains a carbon nanotube solution 3, and its shape can be set according to the shape of the substrate 2, and the plant site, etc. as required, and can be a cuboid, a cube, or a cylinder, etc. In this embodiment, a cuboid shape is used.

In the present disclosure, the formation of the carbon nanotube film is mainly based on the change of the liquid level in the container 1. In order to ensure that the liquid level drops smoothly and forms a more uniform carbon nanotube film, a buffer partition plate 4 is provided at the lower part of the container main body 1, and the peripheral edges of the buffer partition plate 4 are connected with the inner wall of the container main body 1 and located above the solvent lead-out part 5. Wherein, the buffer partition plate 4 and the inner wall of the container main body 1 may be overlapped, bonded, buckled or integrally formed. For example, the inner wall of the container main body 1 can be provided with protrusions along the circumference of the inner wall, and the buffer partition plate 4 can be directly overlapped on the protrusions.

Figure 3:
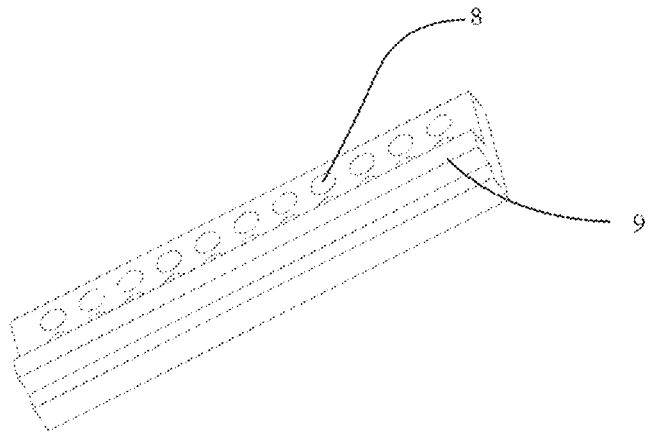
FIG. 3 shows the three-dimensional structural diagram of the buffer partition plate.

FIG. 3 illustrates the structure of the buffer partition plate 4 in detail. The upper surface of the buffer partition plate 4 is provided with a plurality of through holes 8 and a protruding strip-shaped fixing member 9. The arrangement of the through holes 8 can prevent the liquid from directly approaching the solvent lead-out part 5, resulting in uneven solvent lead-out speed and uneven thickness of the carbon nanotube film. The through holes 8 can be arbitrarily distributed on the main body of the buffer partition plate 4, preferably evenly distributed in an array; the diameter of the through hole is preferably 1-3 mm, and the speed of the liquid passing through is relatively smooth and uniform with the hole of this size.

FIG. 3 illustrates the structure of the buffer partition plate 4 in detail. The upper surface of the buffer partition plate 4 is provided with a plurality of through holes 8 and a protruding strip-shaped fixing member 9. The arrangement of the through holes 8 can prevent the liquid from directly approaching the solvent lead-out part 3, resulting in uneven solvent lead-out speed and uneven thickness of the carbon nanotube film. The through holes 8 can be arbitrarily distributed on the main body of the buffer partition plate 4, preferably evenly distributed in an array; the diameter of the through hole is preferably 1-3 mm, and the speed of the liquid passing through is relatively smooth and uniform with the hole of this size.

A solvent lead-out part 5 is provided between the buffer partition plate 4 and the bottom of the container main body 1, which communicates with the interior of the container main body 1 through the through hole 7 in the side wall of the container main body 1 and extends to the outside of the container main body 1. Considering the gravitational effect of the solvent and the pressure of the liquid in the container main body 1, the connection position of the solvent lead-out part 5 and the container main body 1 is preferably close to the bottom wall of the container main body 1. Of course, the number of the solvent lead-out part 5 can also be adjusted according to the quality requirements of the film layer and the film-forming efficiency, and can be one, two or more. In this embodiment, one solvent lead-out part is used as an example.

Wherein, by controlling the length of the solvent lead-out part 5, the control of the liquid level dropping speed is achieved, so as to control the self-assembly film-forming speed of carbon nanotubes on the surface of the substrate 2. Wherein, the length of the solvent lead-out part is preferably greater than 1 cm, more preferably 1-30 cm, and even more preferably 20 cm. The solvent lead-out part 5 can only lead out the solvent in the carbon nanotube solution 3, so that the carbon nanotubes cannot be led out and remain in the container 1, and the carbon nanotubes can be recycled later.

The solvent lead-out part 5 can be a pipeline with a semi-permeable effect, a semi-permeable membrane, a pipeline with a valve installed, or a pipeline connected with a peristaltic pump, so as to quantitatively lead out the solvent in the carbon nanotube solution 5, so as to achieve an accurate liquid level dropping speed. In another embodiment, the solvent lead-out part 5 is preferably a semi-permeable pipeline, the semi-permeable pipeline is perpendicular to the central axis of the container 1 or at a certain angle, and the included angle with the corresponding central axis can be acute or obtuse. Substantially perpendicular is preferred for ease of installation and for maximum solvent passage through the semi-permeable pipeline. The use of this semi-permeable pipeline has the advantages of stable liquid level drop, simple structure, low cost, and suitability for large-area preparation, etc.

EXAMPLE 2

Figure 4:
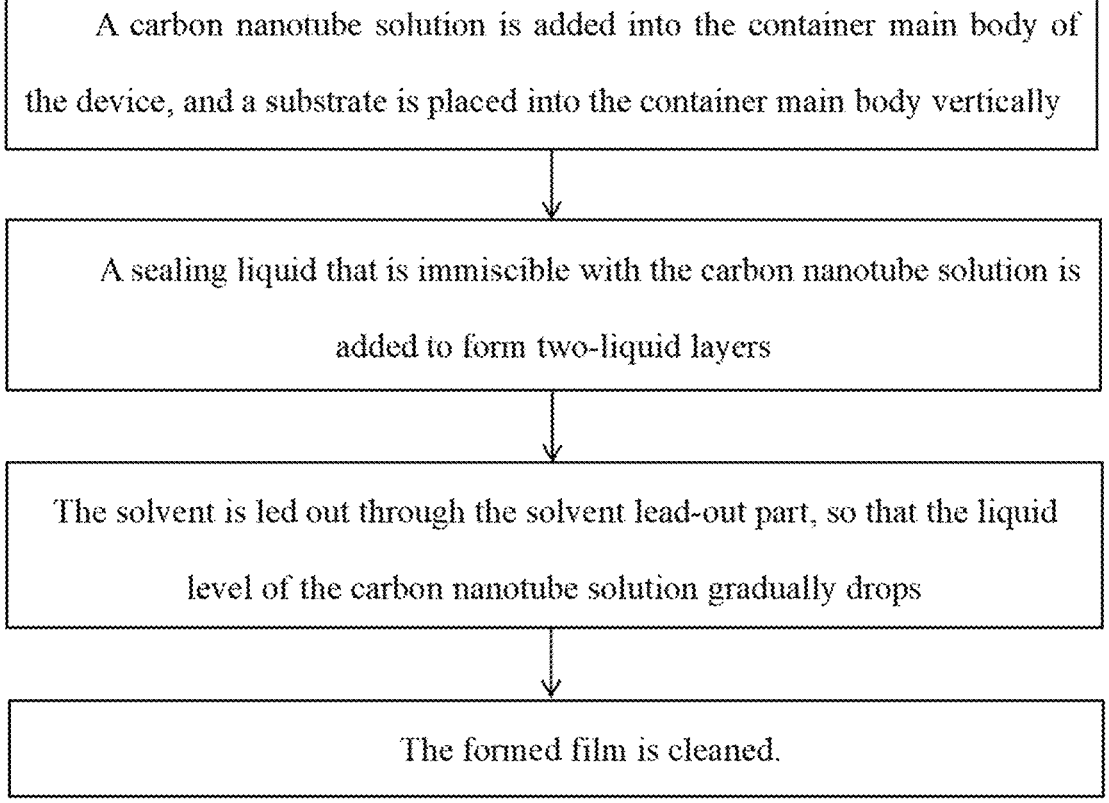
FIG. 4 shows the flow diagram of the carbon nanotube film preparation process.

This embodiment provides a method for preparing a carbon nanotube film by using the above-mentioned device, and the specific steps are shown in FIG. 4. First, a carbon nanotube solution 3 is added into the container main body 1 of the device, then the substrate 2 is placed into the container main body 1 vertically, and then a sealing liquid 6 that is immiscible with the carbon nanotube solution 3 is added along the substrate 2 or the side wall of the container main body 1 to form two-liquid layers. The carbon nanotube solution 3 is formed by dissolving carbon nanotubes in one or more halogenated hydrocarbons, and the halogenated hydrocarbons are preferably chloroform, dichloroethane, trichloroethane, chlorobenzene, dichlorobenzene or bromobenzene. The sealing liquid 6 is one or more of polyol, amine solution or water, all of which are immiscible with the above-mentioned carbon nanotube solution 3. In addition, the temperature of the carbon nanotube film preparation process is from the freezing point of the liquid to the boiling point of the carbon nanotube solution, and the freezing point refers to the higher freezing point temperature in both the sealing liquid 6 and the carbon nanotube solution 3.

The formation principle of the carbon nanotube film in this embodiment is to use the force between the sealing liquid 6 and the carbon nanotube solution 3, and the force is intermolecular force (hydrogen bond/van der Waals force/other non-covalent bond) and covalent bond or ionic bond force. The two immiscible liquids of the sealing liquid 6 and the carbon nanotube solution 3 form two-liquid layers, and the carbon nanotubes in the solution are first adsorbed on the interface between the two-liquid layers. The carbon nanotube solvent seeps out with the solvent lead-out part 5, the liquid level in the container main body 1 gradually drops, and the carbon nanotubes on the interface are aligned on the substrate 2, thereby forming a high-density aligned carbon nanotube film. The carbon nanotube film density is in the range of 120-250 CNT/micron.

At the end, the formed film is cleaned. The film can be directly cleaned without additional peeling and other operations. The cleaning liquid can be selected from organic solvents such as ethanol, isopropanol, toluene, xylene, tetrahydrofuran, or N, N-dimethylformamide, etc.

EXAMPLE 3

Another method for preparing an aligned carbon nanotube film is described in this embodiment. First, a dispersant is added to the carbon nanotube solution 3 to form a carbon nanotube-dispersant composite in the carbon nanotube solution to complete the preparation of the carbon nanotube solution 3. Then polyol or mercaptan that interacts with the carbon nanotube-dispersant composite is added to the carbon nanotube solution, preferably 1%-70% 3-methyl-propanediol. Then the means of water ultrasound or probe ultrasound is used for dispersing for 5 minutes to form a carbon nanotube solution 16 with a dispersant. Then the substrate 2 is placed into the container main body 1 vertically, and then a sealing liquid 6 that is immiscible with the carbon nanotube solution 3 is added along the substrate 2 or the side wall of the container main body 1 to form two-liquid layers. The carbon nanotube solvent seeps out with the solvent lead-out part 5, the liquid level in the container main body 1 gradually drops, and the carbon nanotubes on the interface are aligned on the substrate 2, thereby forming a high-density carbon nanotube aligned film. The carbon nanotube film density is in the range of 120-250 CNT/micron. At the end, the formed film is cleaned.

In this embodiment, by controlling the length of the solvent lead-out part, the control of the liquid level dropping speed is achieved, so as to control the self-assembly speed of carbon nanotubes on the surface of the substrate, so that the liquid level drops smoothly and the large-area aligned carbon nanotube film can be prepared with simple structure and low cost.

EXAMPLE 4

Figure 5:
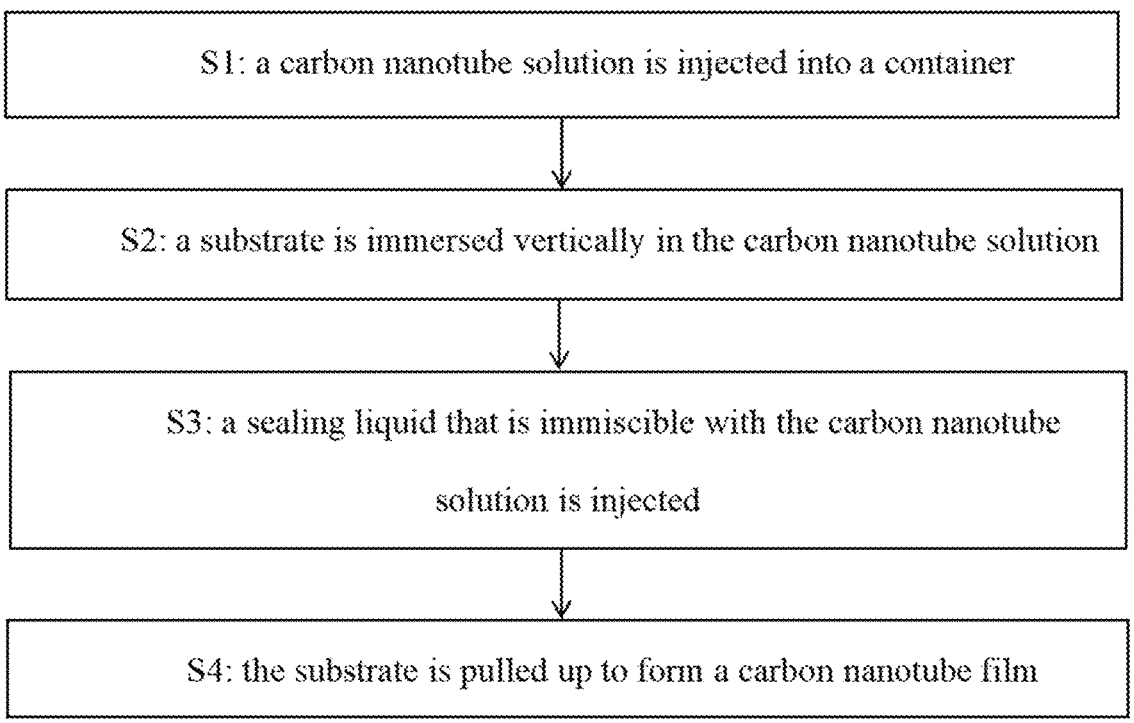
FIG. 5 shows the flow diagram of another carbon nanotube film preparation process of the present disclosure.

FIG. 5 shows a flow diagram of the preparation process of the carbon nanotube film in this embodiment. Specific embodiments of the present disclosure will be described in detail below according to the flow diagram shown in FIG. 5 and the structural diagram of the device for preparing the carbon nanotube film shown in FIG. 6.

Figure 6:
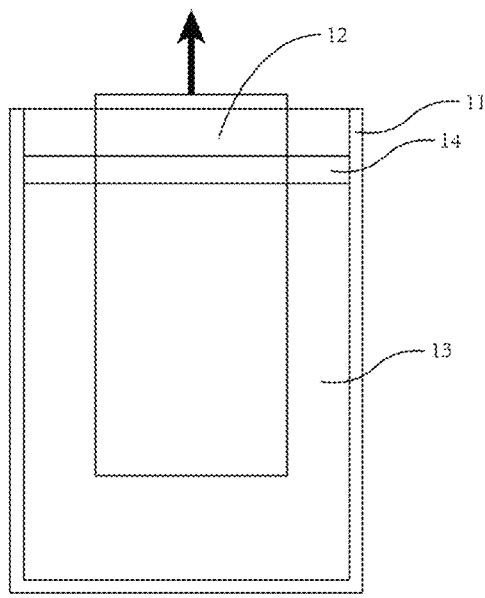
FIG. 6 shows the structural diagram of the device for preparing the carbon nanotube film according to the fourth embodiment of the present disclosure.

As shown in FIG. 5 and FIG. 6, according to step S1, the carbon nanotube solution 13 is prepared first by dissolving carbon nanotubes in one or more halogenated hydrocarbons, preferably organic solvents such as chloroform, dichloroethane, trichloroethane, chlorobenzene, dichlorobenzene, and bromobenzene, etc. Wherein the carbon nanotubes are selected from single-walled carbon nanotubes, double-walled carbon nanotubes or multi-walled carbon nanotubes. Of course, two or more of them can also be selected without affecting the quality of the film. It can be seen that with this method, the selection of carbon nanotubes is also relatively convenient, no special treatment is required, and it is convenient for industrialized production. With the above-mentioned halogenated hydrocarbons, the solubility of carbon nanotubes is better. Then the prepared carbon nanotube solution 3 is injected into the container 1.

Then according to step S2, a substrate 12 is clamped on a pulling machine, and vertically immersed in the carbon nanotube solution 13. The substrate 12 can be glass, metal, silicon wafer or plastic. In terms of shape, it can be flexible or rigid, which is mainly selected according to the shape and performance of the film. In addition, the above-mentioned substrate serves as the basis for the formation of the carbon nanotube film, and its shape can be set according to the required film layer shape, and can be rectangular, square, circular, or other patterns or shapes, which are not limited here.

The substrate 12 can be placed after the carbon nanotube solution is injected into the container, or can be placed before the carbon nanotube solution is injected into the container, and the placement sequence has basically no effect on the carbon nanotube film formation. In this embodiment, the substrate is placed after the carbon nanotube solution is injected into the container. When the substrate 12 enters the carbon nanotube solution 13, it is not necessary to enter the whole substrates 12, and it can be selected according to the size of the film layer. Based on the principle of cost saving, preferably the substrate is immersed in the carbon nanotube solution 13 as much as possible, but since the upper end of the substrate needs to clamp the substrate moving mechanism, more preferably expose this part outside the carbon nanotube solution.

According to step S3, a sealing liquid 14 that is immiscible with the carbon nanotube solution 13 is injected along the substrate 12 or the sidewall of the container 11. The sealing liquid 14 can be one or more of polyol, amine solution or water, all of which are immiscible with the carbon nanotube solution 13. By such selection, an interface between the immiscible two-liquid layers can be formed in the container 11. Since the carbon nanotube solution 13 and the sealing liquid 14 are immiscible with each other, there are intermolecular forces including hydrogen bond/van der Waals force/other non-covalent bond and covalent bond or ionic bond force between the two. Two-liquid layers will be formed on the contact surface, and the carbon nanotubes in the solution are first adsorbed on the interface between the two-liquid layers. As the position of the substrate changes, the position of the interface between the two-liquid layers on the substrate will also change. The carbon nanotubes on the interface are aligned on the substrate in order to form a high-density carbon nanotube aligned film. The carbon nanotube film density is in the range of 120-250 CNT/micron. In addition, the temperature of the carbon nanotube film preparation process is from the freezing point of the liquid to the boiling point of the carbon nanotube solution, and the freezing point refers to the higher freezing point temperature in both the sealing liquid 14 and the carbon nanotube solution 13.

Then according to step S4, the substrate 12 is pulled up by a pulling machine to form a carbon nanotube film parallel to the interface between the two-liquid layers on the substrate. In order to ensure the quality of the film layer, the pulling speed must be kept at a constant speed to avoid sudden speed changes, resulting in changes in film thickness and uniformity, resulting in poor film quality. In addition, if the pulling speed is too fast, the coating quality will be poor; if the pulling speed is too slow, the production efficiency will be low and the cost will be high, which is not in line with industrialization promotion. The pulling speed is preferably between 0.1 μm/sec and 20 μm/sec.

After the pulling is completed, the subsequent cleaning step can be included. The film can be directly cleaned without additional peeling and other operations. The cleaning liquid can be selected from organic solvents such as ethanol, isopropanol, toluene, xylene, tetrahydrofuran, or N,N-dimethylformamide, etc.

EXAMPLE 5

In this embodiment, the preparation of the carbon nanotube solution 13 is completed first, and the carbon nanotube solution 13 is injected into the container 11, wherein the formula of the carbon nanotube solution is the same as that in example 2. Then according to step S2, the sealing solution 14 that is immiscible with the carbon nanotube solution 13 is injected on the carbon nanotube solution 13 along the side wall of the container 11. The sealing liquid 14 can be one or more of polyol, amine solution or water.

Then the substrate 12 can be inserted into the container at a certain speed and immersed in the carbon nanotube solution, a carbon nanotube film perpendicular to the interface between the two-liquid layers is formed on the substrate 12, and the carbon nanotubes in the underlying liquid will be adsorbed to the interface between the upper liquid and the underlying liquid, and then laterally adsorbed to the substrate.

When the carbon nanotube film is prepared by this method, the carbon nanotube solution 13 and the sealing liquid 14 need to be firstly added to the container, and then the substrate 12 is inserted. The height change of the contact position between the substrate and the interface between the two-liquid layers is changed by the downward movement, wherein the inserting speed is preferably between 0.1 μm/s and 20 μm/s, so as to form a high-density carbon nanotube aligned film. The carbon nanotube film density is in the range of 120-250 CNT/micron.

After inserting the substrate to complete the preparation of the carbon nanotube film, the substrate is pulled out as a whole, and subsequent cleaning step is performed. The cleaning liquid can be selected from organic solvents such as ethanol, isopropanol, toluene, xylene, tetrahydrofuran, N,N-dimethylformamide, etc.

EXAMPLE 6

Figure 7:
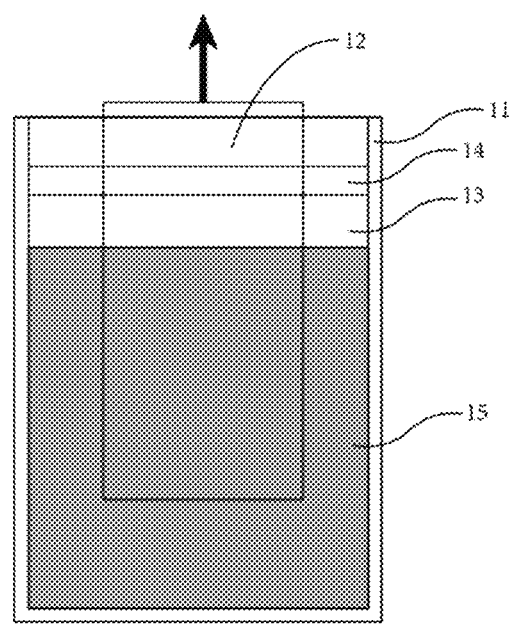
FIG. 7 shows the structural diagram of the device for preparing the carbon nanotube film according to the sixth embodiment of the present disclosure.

As shown in FIG. 7, in this embodiment, the preparation of the carbon nanotube solution 13 is completed first, and then the carbon nanotube solution 13 and the filling medium 15 are injected into the container 11 together. The formula of the carbon nanotube solution is the same as that in example 5. The filling medium includes liquid or solid substance, and the liquid is selected from a solvent or a mixture thereof that is dense and immiscible with the carbon nanotube solution, such as dichloroacetic acid, tetrafluoropropanol, heavy liquid, etc. The solid substance is selected from molecular sieves, polytetrafluoroethylene balls, and glass ball fillers, etc.

Then according to step S2, a substrate 12 is clamped on a pulling machine and immersed vertically in the carbon nanotube solution 3, and then according to step S3, a sealing liquid 14 that is immiscible with the carbon nanotube solution is injected along the substrate or the side wall of the container. The type of the sealing liquid 14 is the same as that in Example 5. The substrate 12 is pulled up by a pulling machine to form a carbon nanotube film parallel to the interface between the two-liquid layers on the substrate 12. Wherein, the pulling speed is preferably between 0.1 μm/sec and 20 μm/sec.

After the pulling is completed, the subsequent cleaning step can be included. The film can be directly cleaned without additional peeling and other operations. The cleaning liquid can be selected from organic solvents such as ethanol, isopropanol, toluene, xylene, tetrahydrofuran, or N, N-dimethylformamide, etc.

In this embodiment, by adding the filling medium into the carbon nanotube solution, the consumption of the carbon nanotube solution is greatly reduced, which has a huge cost advantage, and at the same time, the surface changes caused by the long-term immersion of the substrate in the solution can be avoided.

EXAMPLE 7

Figure 8:
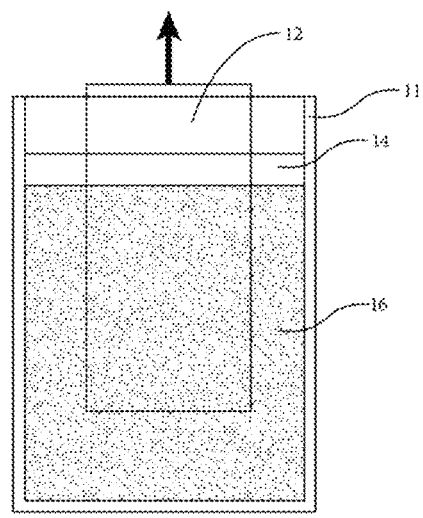
FIG. 8 shows the structural diagram of the device for preparing the carbon nanotube film according to the seventh embodiment of the present disclosure.

As shown in FIG. 8, in this embodiment, the preparation of the carbon nanotube solution 13 is completed first, and the selection of its composition is the same as that in Example 2, then the substance that interacts with the carbon nanotube-dispersant composite is added to the carbon nanotube solution, wherein the substance that interacts with the carbon nanotube-dispersant composite is polyol or mercaptan, preferably 1%-70% 3-methyl-propanediol. Then the means of water ultrasound or probe ultrasound is used for dispersing for 5 minutes to form a carbon nanotube solution 16 with a dispersant.

Then a substrate 12 is clamped on a pulling machine and immersed vertically in the carbon nanotube solution 16 with a dispersant, and then a sealing liquid 14 that is immiscible with the carbon nanotube solution is injected along the substrate or the side wall of the container. The type of the sealing liquid 14 is the same as that in the above-mentioned embodiment. The substrate 12 is pulled up by a pulling machine at a speed of 0.1 μm/sec-20 μm/sec, so as to form a high-density carbon nanotube aligned film, and the density of the carbon nanotube film is in the range of 120-250 CNT/μm.

After the pulling is completed, the subsequent cleaning step can be included. The film can be directly cleaned without additional peeling and other operations. The cleaning liquid can be selected from organic solvents such as ethanol, isopropanol, toluene, xylene, tetrahydrofuran, or N, N-dimethylformamide, etc.

Using the method of this embodiment to prepare the carbon nanotube film, the control of the coating speed can be achieved by controlling the speed of the movement of the substrate, and the carbon nanotube array film that covers the entire substrate can be prepared, and at the same time, the solution can be used repeatedly, with the advantages such as without volatilization pollution problems.

EXAMPLE 8

This embodiment describes another method for preparing a high-density aligned carbon nanotube film. First, a dispersant is added to the carbon nanotube solution, and those skilled in the art can choose from conventional dispersants, such as conjugated PCz (poly[9-(1-octylonoyl)-9H-carbazole 2,7-diyl]. The carbon nanotube-dispersant composite is formed in the carbon nanotube solution, the preparation of the carbon nanotube solution is completed, and then the substrate is placed into the container main body vertically, and then a sealing liquid containing polyol that is immiscible with the carbon nanotube solution is added along the substrate or the side wall of the container main body, so that the polyol only forms a two-liquid area around the peripheral local area of the substrate 12. The polyol in the sealing liquid has an interaction with the carbon nanotube-dispersant composite in the carbon nanotube solution, which is intermolecular force (hydrogen bond/van der Waals force/other non-covalent bond) and covalent bond or ionic bond force. The polyol in the sealing liquid and the carbon nanotube solution 3 are two immiscible liquids to form two-liquid layers. The carbon nanotubes in the solution are first adsorbed on the interface between the two-liquid layers, and then the substrate is pulled up so that with the change of the position of the substrate, the position of the interface between the two-liquid layers on the substrate will also change, and the carbon nanotubes on the interface are aligned on the substrate, thereby forming a high-density carbon nanotube aligned film. In another embodiment, the substrate can be inserted into the above-mentioned solution at a certain speed, so as to form a carbon nanotube aligned film perpendicular to the two-liquid interface. The speed of the above-mentioned pulling or inserting the substrate (12) is 0.1 μm/sec-20 μm/sec.

Figure 9:
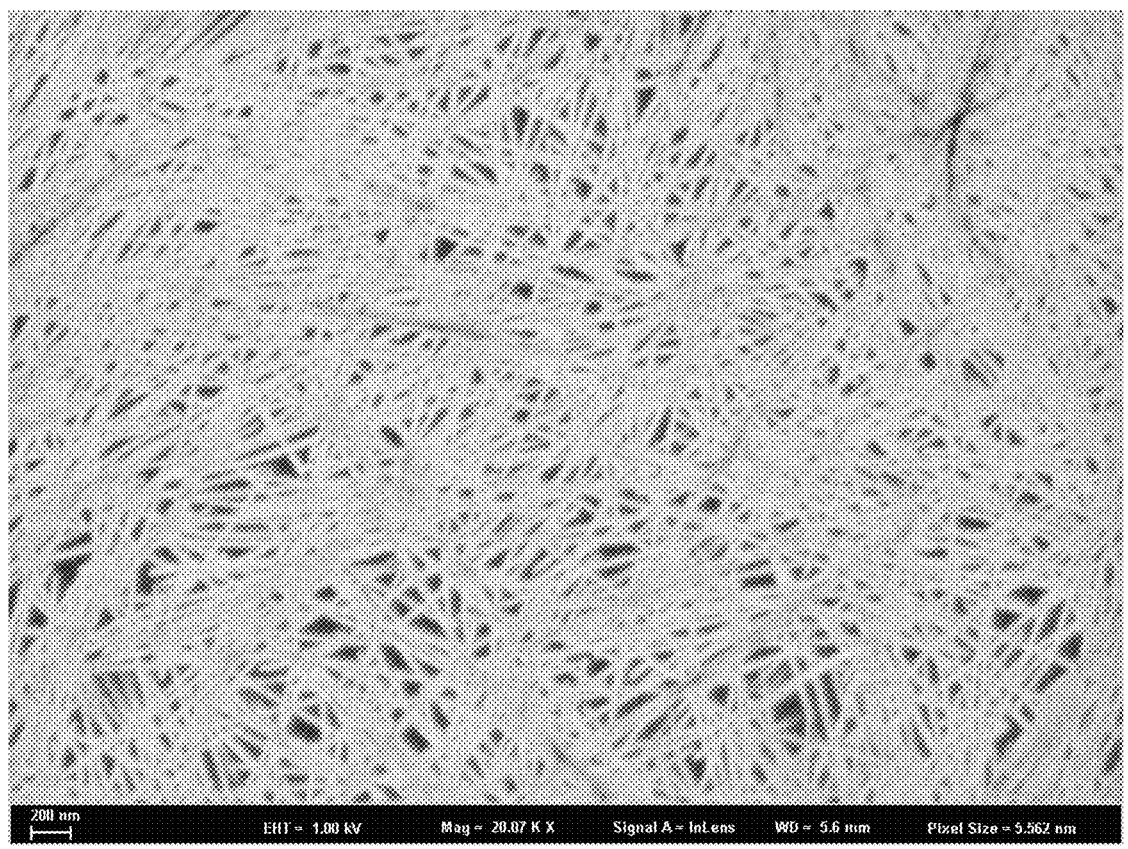
FIG. 9 shows the carbon nanotube film obtained according to the method of the embodiments without adding polyol or mercaptan.
Figure 10:
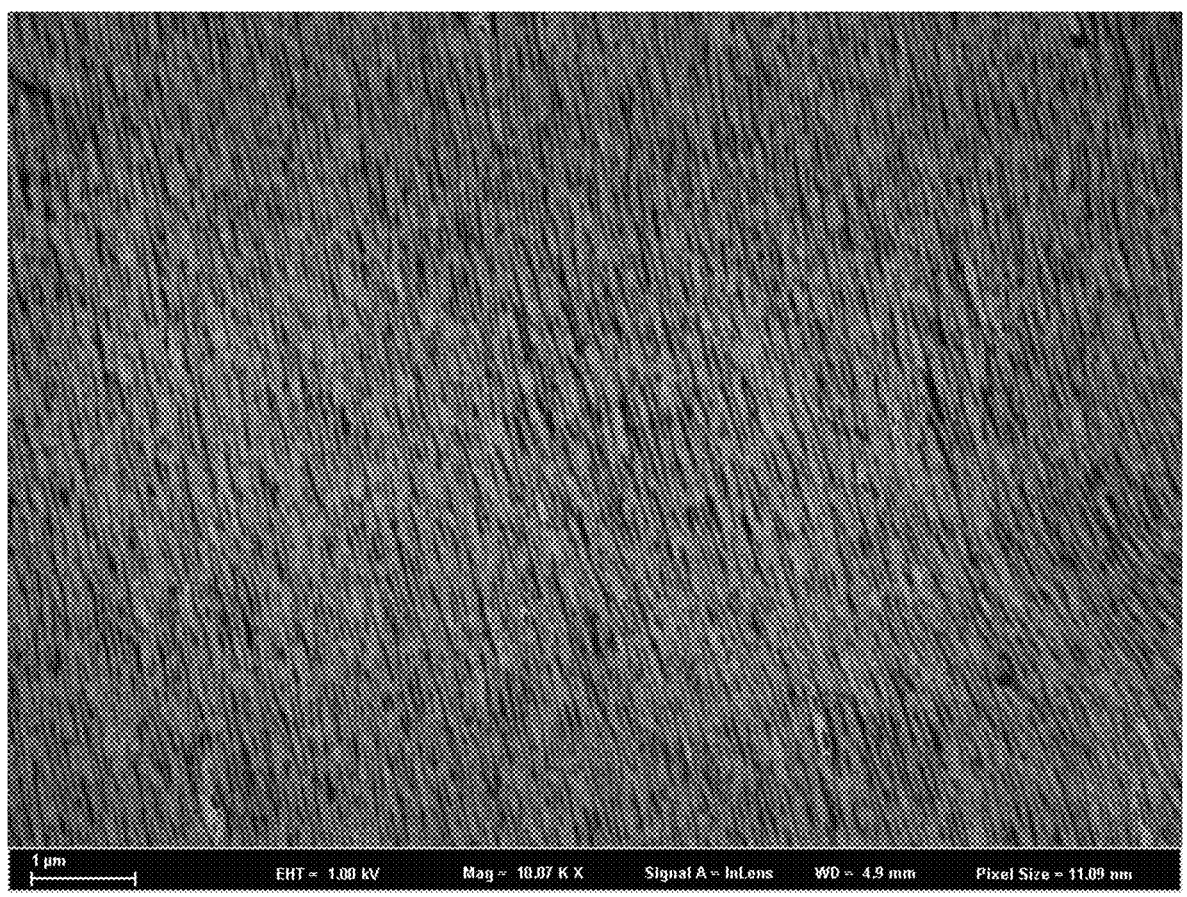
FIG. 10 shows the carbon nanotube film obtained by the method of the embodiments.

In this embodiment, the polyol plays a key role in the above-mentioned method, and the addition of the polyol in accordance with the above-mentioned method has a significant effect compared with no polyol added. As shown in FIG. 9, when the substrate is pulled according to the above-mentioned method without adding polyol, the carbon nanotubes formed on the substrate are disordered, and an aligned carbon nanotube film cannot be formed. The surface morphology of the substrate obtained when polyol is added as the sealing liquid is shown in FIG. 10, in which an aligned carbon nanotube film is obtained, and the film density is in the range of 120-250 CNT/micron. At the end, the formed film is cleaned. In this embodiment, by using polyol as the sealing liquid and performing local controllable injection, the preparation of the high-density aligned carbon nanotube film is achieved.

INDUSTRIAL PRACTICAL APPLICABILITY (1) The present disclosure provides a device with a simple structure that can achieve large-area preparation of an aligned carbon nanotube film. The device obtains a high-density aligned carbon nanotube film by adding a carbon nanotube film of a special formula, and at the same time leading out the solvent to achieve the liquid level change.

(2) When the present disclosure uses the above-mentioned pulling method to prepare the aligned carbon nanotube film, the film-forming speed can be achieved by controlling the moving speed of the substrate, which is very easy to control; in addition, because the carbon nanotube solution does not need to be discharged or evaporated, there will be no loss and pollution, and it can be reused, which will greatly reduce the cost.

(3) By add the filling medium into the carbon nanotube solution, the present disclosure greatly reduces the consumption of the carbon nanotube solution, which has a huge cost advantage, and is beneficial to industrial application.

Although the present disclosure has been described in detail above with general description and specific embodiments, some modifications or improvements can be made on the basis of the present disclosure, which is obvious to those skilled in the art. Therefore, these modifications or improvements made without departing from the spirit of the present disclosure fall within the scope of the claimed protection of the present disclosure.

The invention claimed is:

1. A method for forming an aligned carbon nanotube film, comprising:
   adding a carbon nanotube solution into a container main body, wherein:
      the container main body comprises a buffer partition plate that divides the container main body into an upper portion and a lower portion, wherein:
         peripheral edges of the buffer partition plate are connected with an inner wall of the container main body; and
         the buffer partition plate comprises a protruding strip-shaped fixing member and a plurality of through holes;
   placing a substrate into the upper portion of the container main body vertically;
   adding a sealing liquid that is immiscible with the carbon nanotube solution along the substrate or the side wall of the container main body to form two-liquid layers in the upper portion of the container main body;
   ensuring, by using the buffer partition plate, the carbon nanotube solution passing through smoothly and uniformly from the upper portion of container main body to the lower portion of container main body;

leading a solvent out through a solvent lead-out part so that a liquid level of the carbon nanotube solution gradually drops to form the aligned carbon nanotube film on the substrate, wherein:

the solvent lead-out part communicates with an interior of the lower portion of the container main body through a through hole in a side wall of the container main body and extends to an outside of the container main body;

the solvent lead-out part comprises a pipeline having a semi-permeable effect; and a dropping speed of the liquid level of the carbon nanotube solution is controlled by adjusting a length of the solvent lead-out part; and cleaning the carbon nanotube film formed on the substrate.

2. The method for forming the aligned carbon nanotube film of claim 1, further comprising:

dissolving carbon nanotubes in one or more halogenated hydrocarbons to form the carbon nanotube solution.

3. The method for forming the aligned carbon nanotube film of claim 2, further comprising:

selecting the one or more halogenated hydrocarbons from one or more of chloroform, dichloroethane, trichloroethane, chlorobenzene, dichlorobenzene, and bromobenzene.

4. The method for forming the aligned carbon nanotube film of claim 3, wherein the adding of the sealing liquid comprises adding one or more of polyol, amine solution or water.

5. The method for forming the aligned carbon nanotube film of claim 1, further comprising:

forming the carbon nanotube film at a temperature in a range between a freezing point of the sealing liquid and a boiling point of the carbon nanotube solution.

6. The method for forming the aligned carbon nanotube film of claim 1, further comprising:

after adding the carbon nanotube solution into the container main body, adding a dispersant to form a carbon nanotube-dispersant composite;

adding a substance that interacts with the carbon nanotube-dispersant composite to form a second carbon nanotube solution with a dispersant; and dispersing the second carbon nanotube solution with the dispersant using water ultrasonic or probe ultrasonic.

7. The method for forming the aligned carbon nanotube film of claim 6, wherein the adding of the substance that interacts with the carbon nanotube-dispersant composite comprises adding polyol, mercaptan, or 3-methyl-propanediol with a concentration in a range between 1% and 70%.

* * * * *